United States Patent
Maruyama et al.

(10) Patent No.: US 10,811,456 B2
(45) Date of Patent: Oct. 20, 2020

(54) IMAGING APPARATUS AND MANUFACTURING METHOD

(71) Applicant: SONY SEMICONDUCTOR SOLUTIONS CORPORATION, Kanagawa (JP)

(72) Inventors: Shunsuke Maruyama, Kanagawa (JP); Takeshi Yanagita, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/298,395

(22) Filed: Mar. 11, 2019

(65) Prior Publication Data

US 2019/0206921 A1 Jul. 4, 2019

Related U.S. Application Data

(62) Division of application No. 15/761,475, filed as application No. PCT/JP2016/077789 on Sep. 21, 2016, now Pat. No. 10,522,582.

(30) Foreign Application Priority Data

Oct. 5, 2015 (JP) .................................. 2015-197390

(51) Int. Cl.
*H01L 27/14* (2006.01)
*H01L 27/146* (2006.01)
(Continued)

(52) U.S. Cl.
CPC .......... *H01L 27/14636* (2013.01); *G01J 1/02* (2013.01); *H01L 27/14652* (2013.01);
(Continued)

(58) Field of Classification Search
CPC ............. H01L 21/76898; H01L 23/481; H01L 27/14–14893; H01L 21/768; H04N 5/374
See application file for complete search history.

(56) References Cited

U.S. PATENT DOCUMENTS 5,318,666 A * 6/1994 Elkind .................. H01L 21/461
257/E21.483
8,476,729 B2 * 7/2013 Inoue ................ H01L 27/14618
257/459
(Continued)

FOREIGN PATENT DOCUMENTS

CN 104882460 A 9/2015
JP 05-218377 A 8/1993
(Continued)

OTHER PUBLICATIONS

Non-Final Office Action for U.S. Appl. No. 15/761,475, dated Mar. 25, 2019, 10 pages.
(Continued)

*Primary Examiner* — Jarrett J Stark
(74) *Attorney, Agent, or Firm* — Chip Law Group

(57) ABSTRACT

An imaging apparatus and a manufacturing method which enables sensitivity of the imaging apparatus using infrared rays to be improved. The imaging apparatus includes a light-receiving element array in which a plurality of light-receiving elements including a compound semiconductor having light-receiving sensitivity in an infrared range are arrayed, a signal processing circuit that processes a signal from the light-receiving element, an upper electrode formed on a light-receiving surface side of the light-receiving element, and a lower electrode that is paired with the upper electrode, in which the light-receiving element array and the signal processing circuit are joined to each other with a film of a predetermined material, the upper electrode and the signal processing circuit are connected to each other through
(Continued)

a through-via-hole penetrating a part of the light-receiving element, and the lower electrode is made as an electrode common to the light-receiving elements arrayed in the light-receiving element array.

5 Claims, 14 Drawing Sheets

(51) Int. Cl.
| | | |
|---|---|---|
| *G01J 1/02* | (2006.01) | |
| *H04N 5/33* | (2006.01) | |
| *H01L 31/10* | (2006.01) | |
| H01L 21/768 | (2006.01) | |
| H01L 23/48 | (2006.01) | |
| H04N 5/374 | (2011.01) | |
| H04N 5/378 | (2011.01) | |

(52) U.S. Cl.
CPC ........ *H01L 27/14694* (2013.01); *H01L 31/10* (2013.01); *H04N 5/33* (2013.01); *H01L 21/76898* (2013.01); *H01L 23/481* (2013.01); *H01L 27/14* (2013.01); *H04N 5/374* (2013.01); *H04N 5/378* (2013.01)

(56) References Cited

U.S. PATENT DOCUMENTS

| | | | |
|---|---|---|---|
| 8,492,864 B2* | 7/2013 | Watanabe | H01L 27/1464 257/435 |
| 8,541,820 B2* | 9/2013 | Hayasaki | H01L 21/76898 257/184 |
| 8,946,797 B2 | 2/2015 | Mizuta et al. | |
| 8,963,272 B2 | 2/2015 | Maekawa et al. | |
| 9,060,143 B2 | 6/2015 | Honda et al. | |
| 9,136,304 B2* | 9/2015 | Maeda | H01L 21/76898 |
| 9,160,953 B2 | 10/2015 | Oishi | |
| 9,263,490 B2* | 2/2016 | Yanagita | H01L 27/14636 |
| 9,379,006 B2 | 6/2016 | Kagawa et al. | |
| 9,595,558 B2* | 3/2017 | Petilli | H01L 27/1464 |
| 9,865,549 B2 | 1/2018 | Shigetoshi | |
| 9,917,128 B2* | 3/2018 | Takahashi | H01L 21/76898 |
| 9,954,111 B2 | 4/2018 | Yamazaki et al. | |
| 10,128,301 B2 | 11/2018 | Umebayashi et al. | |
| 10,180,354 B2* | 1/2019 | Kurokawa | H01L 27/06 |
| 10,312,281 B2* | 6/2019 | Akiyama | H01L 27/1463 |
| 10,321,079 B2* | 6/2019 | Miyazawa | H04N 5/341 |
| 10,355,036 B2* | 7/2019 | Ando | H01L 24/09 |
| 10,418,393 B2* | 9/2019 | Han | H04N 5/378 |
| 10,515,999 B2* | 12/2019 | Segawa | G01J 4/04 |
| 10,541,263 B2* | 1/2020 | Kim | H04N 5/378 |
| 10,600,838 B2* | 3/2020 | Wakiyama | H01L 27/14643 |
| 2012/0044415 A1 | 2/2012 | Tsuduki et al. | |
| 2013/0341694 A1 | 12/2013 | Maekawa et al. | |
| 2015/0228685 A1 | 8/2015 | Uchida et al. | |
| 2015/0243694 A1 | 8/2015 | Ihara | |
| 2015/0270314 A1 | 9/2015 | Miyazaki et al. | |
| 2016/0020235 A1* | 1/2016 | Yamashita | H01L 27/14612 250/208.1 |
| 2016/0172391 A1 | 6/2016 | Ihara | |
| 2017/0191874 A1* | 7/2017 | Suzuki | G01J 5/34 |
| 2017/0338268 A1 | 11/2017 | Mitsuhashi et al. | |
| 2018/0102442 A1 | 4/2018 | Wang et al. | |
| 2018/0261641 A1* | 9/2018 | Maruyama | G01J 5/24 |
| 2019/0333954 A1* | 10/2019 | Wakiyama | H01L 27/14603 |
| 2019/0355769 A1* | 11/2019 | Yajima | H01L 27/14603 |

FOREIGN PATENT DOCUMENTS

| | | |
|---|---|---|
| JP | 2012-129247 A | 7/2012 |
| JP | 2014-060380 A | 4/2014 |
| JP | 2015-149422 A | 8/2015 |
| JP | 2015-162679 A | 9/2015 |
| KR | 10-2015-0101681 A | 9/2015 |
| TW | 201543659 A | 11/2015 |

OTHER PUBLICATIONS

International Search Report and Written Opinion of PCT Application No. PCT/JP2016/077789, dated Dec. 6 2016, 08 pages of English Translation and 07 pages of ISRWO.

International Preliminary Report on Patentability of PCT Application No. PCT/JP2016/077789, dated Apr. 19, 2018, 08 pages of English Translation and 05 pages of IPRP.

Non-Final Office Action in U.S. Appl. No. 15/761,475 dated Mar. 25, 2019.

Notice of Allowance in U.S. Appl. No. 15/761,475 dated Aug. 28, 2019.

* cited by examiner

IMAGING APPARATUS AND MANUFACTURING METHOD

CROSS REFERENCE TO RELATED APPLICATIONS

The present application is a divisional application of U.S. patent application Ser. No. 15/761,475, filed on Mar. 20, 2018, which is a National Stage Entry of Patent Application No. PCT/JP2016/077789 filed on Sep. 21, 2016, which claims priority from prior Japanese Patent Application JP 2015-197390 filed in the Japan Patent Office on Oct. 5, 2015, the entire contents of which are hereby incorporated by reference.

TECHNICAL FIELD

The present technology relates to an imaging apparatus and a manufacturing method. More particularly, the present technology relates to an imaging apparatus having light-receiving sensitivity in an infrared range and a manufacturing method.

BACKGROUND ART

In an imaging apparatus including a photodiode array formed in a compound semiconductor, read-out electrodes of a silicon IC for signal read-out (ROIC: Read Out IC) face electrodes of those photodiodes, and conduction is made with bumps provided between the two types of electrodes. In an infrared range of a wavelength longer than that of a visible range, the photodiodes are formed of the compound semiconductor. Thus, it is sometimes called hybrid configuration of the compound semiconductor and the silicon (IC).

Crystals of that compound semiconductor are weak against mechanical force. Thus, soft indium (In) having a low melting point is often used for those bumps. Due to such characteristics thereof, the indium bumps are liable to deformation and become non-uniform when these are mounted on the electrodes of the photodiodes or the read-out electrodes of the ROIC. Several tens of thousands to several hundreds of thousands of bumps are provided for each imaging apparatus, and it is difficult to prevent the bumps from being greatly deformed. For example, Patent Literature 1 and Patent Literature 2 have proposed measures against it.

CITATION LIST

Patent Literature

Patent Literature 1: Japanese Patent Application Laid-open No. 2011-96921
Patent Literature 2: Japanese Patent Application Laid-open No. 2010-157667

DISCLOSURE OF INVENTION

Technical Problem

As described above, the photodiode needs to be formed of the compound semiconductor in the infrared range of the wavelength longer than that of the visible range. Thus, for example, there is a limitation on a material or the like used for the bumps. In addition, due to such a limitation, the bumps easily have variation in height and are liable to short-circuit, and hence it is difficult to control them and it is difficult to achieve array formation and miniaturization.

Further, in accordance with the structures described in Patent Literature 1 and Patent Literature 2, an electrode for collecting a carrier is located in a surface on a side opposite to the light-receiving surface, and there is a possibility that the carrier photoelectrically converted at a front face of the light-receiving surface may be re-combined before it reaches the electrode and the sensitivity may lower.

The present technology has been made in view of the above-mentioned circumstances to enable array formation and miniaturization to be achieved also in a case where a photodiode is formed of a compound semiconductor, and to prevent the sensitivity from lowering.

Solution to Problem

In accordance with an aspect of the present technology, there is provided an imaging apparatus includes: a light-receiving element array in which a plurality of light-receiving elements including a compound semiconductor having light-receiving sensitivity in an infrared range are arrayed; a signal processing circuit that processes a signal from the light-receiving element; an upper electrode formed on a light-receiving surface side of the light-receiving element; and a lower electrode that is paired with the upper electrode, in which the light-receiving element array and the signal processing circuit are joined to each other with a film of a predetermined material, the upper electrode and the signal processing circuit are connected to each other through a through-via-hole penetrating a part of the light-receiving element, and the lower electrode is made as an electrode common to the light-receiving elements arrayed in the light-receiving element array.

The compound semiconductor may be a group III-V semiconductor compound.

The lower electrode and the electrode may be connected to each other through a through-via-hole penetrating to an electrode provided in a lower portion of the light-receiving element.

The lower electrode may be, at an outer peripheral portion of the light-receiving element array, connected to an electrode provided in a lower portion of the light-receiving element.

The lower electrode may be connected to the signal processing circuit at an outer peripheral portion of the light-receiving element array.

The through-via-hole may have an interior covered with a fixed-charge film on which a part of the upper electrode is stacked.

In accordance with an aspect of the present technology, there is provided a manufacturing method of manufacturing an imaging apparatus including a light-receiving element array in which a plurality of light-receiving elements each including a compound semiconductor having light-receiving sensitivity in an infrared range are arrayed, a signal processing circuit that processes a signal from the light-receiving element, an upper electrode formed on a light-receiving surface side of the light-receiving element, and a lower electrode that is paired with the upper electrode, the manufacturing method including steps of: joining the light-receiving element array and the signal processing circuit to each other with a film of a predetermined material; forming a through-via-hole penetrating a part of the light-receiving element; connecting the upper electrode and the signal processing circuit to each other through the through-via-hole; and forming the lower electrode as an electrode common to the light-receiving elements arrayed in the light-receiving element array.

The compound semiconductor may be a group III-V semiconductor compound.

The manufacturing method may further include steps of: forming an electrode in a lower portion of the light-receiving element; forming, in a part of the light-receiving element, a through-via-hole penetrating to an upper surface of the electrode; and connecting the lower electrode and the electrode to each other through the through-via-hole.

The manufacturing method may further include a step of connecting, at an outer peripheral portion of the light-receiving element array, the lower electrode to an electrode provided in a lower portion of the light-receiving element.

The manufacturing method may further include a step of connecting the lower electrode to the signal processing circuit at an outer peripheral portion of the light-receiving element array.

In the imaging apparatus according to the aspect of the present technology, the light-receiving element array in which the plurality of light-receiving elements including the compound semiconductor having light-receiving sensitivity in the infrared range are arrayed, the signal processing circuit that processes the signal from the light-receiving element, the upper electrode formed on the light-receiving surface side of the light-receiving element, and the lower electrode that is paired with the upper electrode are provided. Further, the light-receiving element array and the signal processing circuit are joined to each other with the film of the predetermined material, the upper electrode and the signal processing circuit are connected to each other through the through-via-hole penetrating the part of the light-receiving element, and the lower electrode is made as the electrode common to the light-receiving elements arrayed in the light-receiving element array.

In the manufacturing method according to the aspect of the present technology, the above-mentioned imaging apparatus is manufactured.

Advantageous Effects of Invention

In accordance with the aspect of the present technology, it is possible to achieve array formation and miniaturization also in a case where a photodiode is formed of a compound semiconductor, and to prevent the sensitivity from lowering.

It should be noted that the effects described here are not necessarily limitative and any effect described in the present disclosure may be provided.

MODE(S) FOR CARRYING OUT THE INVENTION

Hereinafter, modes (hereinafter, referred to as embodiments) for carrying out the present technology will be described. Note that descriptions will be made in the following order.
1. Configuration of Pixel
2. Configuration of Light-Receiving Layer Area
3. Regarding manufacture
4. Usage Examples of Imaging Apparatus
<Configuration of Pixel>

Figure 1:
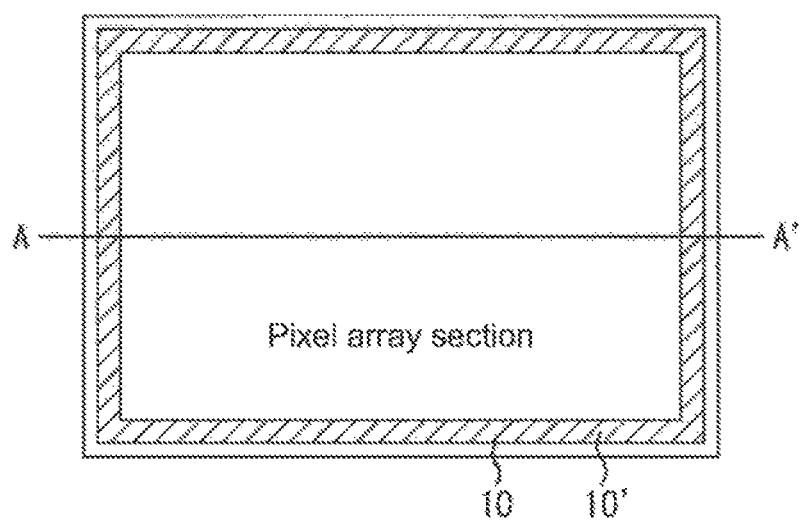
FIG. 1 A diagram showing a configuration of a pixel array section.

The present technology can be applied to an imaging apparatus including an infrared image sensor. The imaging apparatus can be, for example, an apparatus that detects persons, objects, and the like. The imaging apparatus includes a pixel array section 10 in a light-receiving layer area as shown in FIG. 1. A plurality of pixels are arranged in an array form in the pixel array section 10. The pixels arrayed in the pixel array section 10 are light-receiving elements including a compound semiconductor having light-receiving sensitivity in an infrared range.

A signal processing circuit (not shown in FIG. 1) and the like are stacked in a lower layer on the light-receiving layer area. The signal processing circuit performs read-out processing on signals from the pixels (light-receiving elements) arranged in the pixel array section 10.

The pixels arranged in an outer peripheral portion of the light-receiving layer area (portion shown with oblique lines in FIG. 1 and hereinafter, referred to as pixel array section 10') and the pixels arranged in an area other than the outer peripheral portion of the light-receiving layer area (area located inside a portion with oblique lines in FIG. 1) have a partially different configurations.

Figure 2:
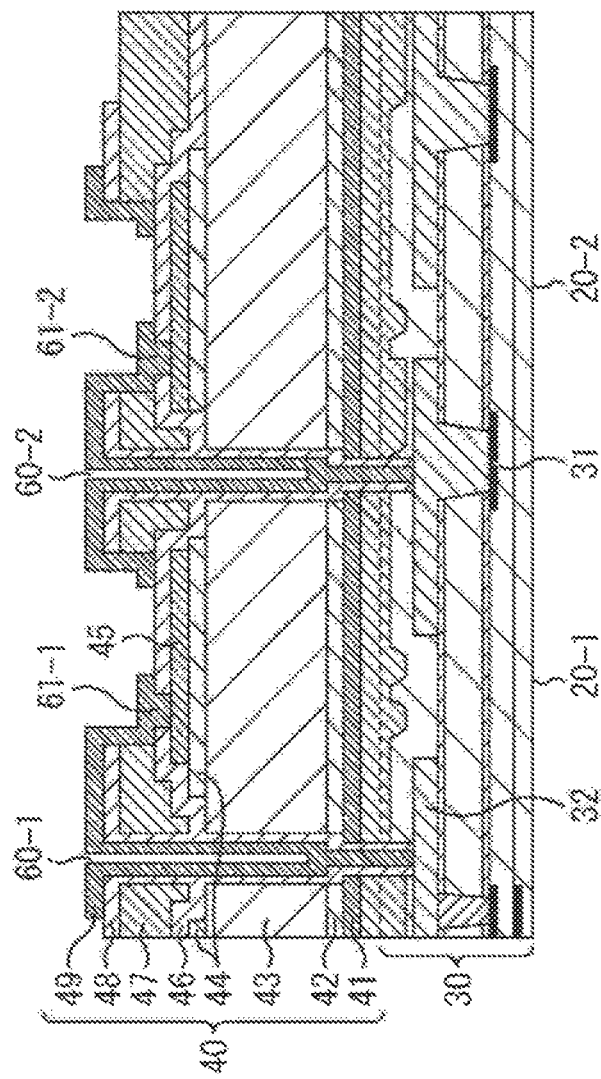
FIG. 2 A diagram showing a configuration of pixels.
Figure 3:
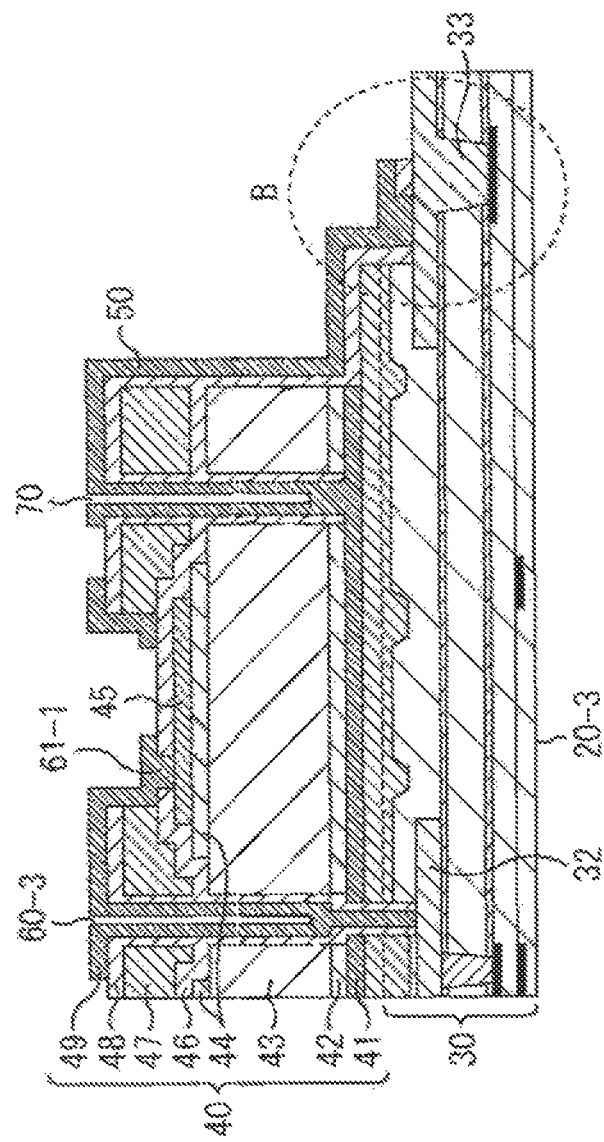
FIG. 3 A diagram showing a configuration of a pixel located in an outer peripheral portion.

FIG. 2 shows configurations of pixels arranged in the area other than the outer peripheral portion of the light-receiving layer area, and shows, for example, a cross-sectional view as taken along the line A-A' of FIG. 1. FIG. 3 shows a configuration of a pixel arranged in the outer peripheral portion (pixel array section 10') of the light-receiving layer area, and shows, for example, a cross-sectional view as taken along the line A-A' of FIG. 1.

FIG. 2 shows a pixel 20-1 and a pixel 20-2 arranged inside the light-receiving layer area. Hereinafter, the pixel 20-1 and the pixel 20-2 will be simply referred to pixels 20 if it is unnecessary to individually distinguish them. Other portions will be referred in a similar way.

The pixel 20 has a configuration in which a signal processing circuit 30 and an infrared image sensor 40 are stacked. The infrared image sensor 40 functions as a light-receiving element. The signal processing circuit 30 can be a circuit called ROIC (readout integrated circuit) or the like. The signal processing circuit 30 reads out signals photo-electrically converted at the infrared image sensor 40, and processes the read-out signals.

A wiring layer including an electrode 31 and the wire 32, which are connected to the infrared image sensor 40, is formed in the signal processing circuit 30. For example, the electrode 31 is formed of Cu (copper) and the wire 32 is formed of Al (aluminum).

The infrared image sensor 40 is made adhere to the signal processing circuit 30 as substrate adhesion. SiO2 (silicon dioxide) can be used for making the infrared image sensor 40 adhere to the signal processing circuit 30. First of all, an electrode 41 is stacked on a side of the infrared image sensor 40, which is closer to the signal processing circuit 30. The electrode 41 is, for example, formed of W (tungsten) and Ti (titanium). As described later with reference to FIG. 3, the electrode 41 is provided as an electrode that is connected to a grounded lower electrode 50 and is paired with an upper electrode 49.

An n-InP layer (n-InAlAs layer) 42 is stacked in an upper layer on the electrode 41. An i-InGaAs layer 43 is stacked on the n-InP layer 42 that functions as a part of a light-receiving layer. Here, the description will be continued assuming that the light-receiving layer includes an InGaAs layer. However, for example, it can also have a type-II InGaAs/GaAsSb multiple quantum well structure. The InGaAs layer has a small band gap. Thus, the InGaAs layer is capable of receiving light in the infrared range even when it is used alone. Further, by combining the multiple quantum well structure with a group III-V semiconductor compound of another type, for example, GaAsSb, electrons can experience type II transition from the valence band of GaAsSb to the conduction band of InGaAs during light reception. Thus, it becomes possible to receive light in a longer wavelength range.

A P—InP layer 44 is stacked in an opened portion of the i-InGaAs layer 43. An ITO 45 is stacked on the P—InP layer 44, as a transparent electrode. In addition, a protection film 46 is stacked on the ITO 45.

An insulation film 47 is stacked in a portion other than an opening portion of the protection film 46. This insulation film 47 can be formed of SiO2. On the insulation film 47, a protection film 48 is stacked, and the upper electrode 49 is further stacked. The upper electrode 49 is connected to the ITO 45.

A through-via-hole 60 is formed between the pixels 20. In the example shown in FIG. 2, a through-via-hole 60-1 is formed on a left-hand side of the pixel 20-1 and a through-via-hole 60-2 is formed on a right-hand side. On a side surface of the through-via-hole 60, the upper electrode 49 and the protection film 48 are deposited. In other words, the upper electrode 49 is deposited at a center portion of the through-via-hole 60, and the protection film 48 is deposited inside that upper electrode 49 (on a side of the light-receiving layer).

The protection film 48 functions as an insulation film. The protection film 48 has a structure in which an insulation film is formed between the light-receiving layer and the upper electrode 49 inside the through-via-hole 60.

Note that, although the upper electrode 49 deposited inside the through-via-hole 60 shown in FIG. 2 is shown having a shape with a clearance, the upper electrode 49 may be deposited in a state having no clearances. In other words, a configuration in which the through-via-hole 60 is filled with the material of the upper electrode 49 may be employed.

The protection film 46 and the protection film 48 may be made of an identical material or may be made of different materials. The protection film 46 and the protection film 48 can be formed of, for example, HfO, AlO, TaO, SiN, and SiON. Further, the protection film covering an interior of the through-via-hole 60 becomes the protection film 48 since the pixel 20 is manufactured in a manufacturing process to be described later. The protection film covering the interior of the through-via-hole 60 can be a fixed-charge film having negative bias. The fixed-charge film can be a film formed of HfO, AlO, TaO, SiN, and SiON described above.

One side of the upper electrode 49 is connected to the wire 32 inside the signal processing circuit 30 and the other side is connected to the ITO 45. The upper electrode 49 and the ITO 45 are connected to each other through a through-via-hole 61. The through-via-hole 61 is formed to penetrate the protection film 46 of the infrared image sensor 40, and the penetrating through-via-hole 61 is filled with the material of the upper electrode 49. In this manner, the upper electrode 49 and the ITO 45 are connected to each other.

The upper electrode 49 is an electrode for collecting charges photoelectrically converted at the light-receiving layer (i-InGaAs layer 43). Light is input from above in FIG. 2 and received by the light-receiving layer. The upper electrode 49 is provided on a light input side (light-receiving surface side). Thus, a carrier photoelectrically converted at the surface of the light-receiving layer can be efficiently collected, which enables the sensitivity to be improved.

With a conventional structure in which an upper electrode is provided on a side opposite to a light-receiving surface, there is a possibility that a carrier photoelectrically converted at the light-receiving surface may be re-combined before it reaches the upper electrode and thus the sensitivity may lower. However, in the pixel 20 to which the present technology is applied, the upper electrode 49 is provided on the light-receiving surface side. Thus, it becomes possible to prevent a generated carrier from being re-combined before it reaches the upper electrode 49, and it becomes possible to prevent the sensitivity from lowering.

Further, with a structure in which the infrared image sensor and the signal processing circuit are connected to each other with bumps like conventional one, there are problems related to control of variation in height of the bumps, short-circuit, and the like, and it is difficult to achieve array formation and miniaturization. However, in accordance with the present technology, the structure in which the infrared image sensor 40 and the signal processing circuit 30 are connected to each other with bumps is not employed. Thus, it is possible to overcome the problems which occur due to the connection with bumps.

As described above, the upper electrode 49 of each pixel 20 is connected to the wire 32 inside the signal processing circuit 30 through the through-via-hole 60. The through-via-hole 60 penetrates the infrared image sensor 40 (light-receiving layer) and is formed to a surface of the wire 32 inside the signal processing circuit 30. The lower electrode that is paired with the upper electrode 49 is provided in the pixel arranged in the outer peripheral portion (pixel array section 10) of the pixel array section 10.

FIG. 3 shows a configuration of a pixel arranged in the outer peripheral portion (pixel array section 10') of the light-receiving area, and shows, for example, a cross-sectional view as taken along the line A-A' of FIG. 1. In FIG. 3, a pixel 20-3 located in the pixel array section 10' is shown.

A configuration of the pixel 20-3 is different from that of the pixel 20-1 shown in FIG. 2 in that it is provided with a lower electrode 50, and other portions of the pixel 20-3 are similar to those of the pixel 20-1 shown in FIG. 2. Thus, descriptions of similar configurations will be omitted.

A through-via-hole 70 is provided on an outer peripheral portion side (right-hand side in the figure) of the pixel 20-3 has a structure different from that of the through-via-hole 60 provided in an area other than the outer peripheral portion.

The through-via-hole 70 is provided to the electrode 41, which constitutes the infrared image sensor 40, without penetrating the infrared image sensor 40 (light-receiving layer) unlike the through-via-hole 60. Inside the through-via-hole 70, the lower electrode 50 and the protection film 48 are deposited. The lower electrode 50 is connected to the electrode 41 by being deposited inside the through-via-hole 70. That is, the electrode 41 functions as a lower electrode by being connected to the lower electrode 50, and is provided as a part of the lower electrode 50.

Now, the through-via-hole 60 shown on a left-hand side of the pixel 20-3 shown in FIG. 3 is compared with the through-via-hole 70 shown on a right-hand side. The through-via-hole 60 penetrates the infrared image sensor 40. In an inside thereof, the upper electrode 49 and the protection film 48 are deposited. The protection film 48 is deposited between the upper electrode 49 and the electrode 41. Thus, the upper electrode 49 and the electrode 41 are not connected to each other.

On the other hand, the through-via-hole 70 does not penetrate the infrared image sensor 40. In an inside thereof, the lower electrode 50 and the protection film 48 are deposited. Further, the lower electrode 50 is connected to the electrode 41. Therefore, the electrode 41 constitutes a part of the lower electrode 50.

In this manner, the pixel 20 that constitutes the pixel array section 10 has a configuration in which the upper electrode 49 is formed in an upper portion and the lower electrode 50 (electrode 41) is formed in a lower portion.

At an end portion of the pixel array section 10' (portion B on the right-hand side in FIG. 3, which is surrounded by a dotted-line circle), the lower electrode 50 is connected to a wire 33 inside the signal processing circuit 30. The wire 33 connected to this lower electrode 50 is grounded.

As described with reference to FIG. 3, the configuration in which the lower electrode 50 and the electrode 41 are connected to each other due to the provision of the through-via-hole 70 may be employed. However, as shown in FIG. 4, a configuration in which the lower electrode 50 and the electrode 41 are connected to each other without the through-via-hole 70 can also be employed.

Figure 4:
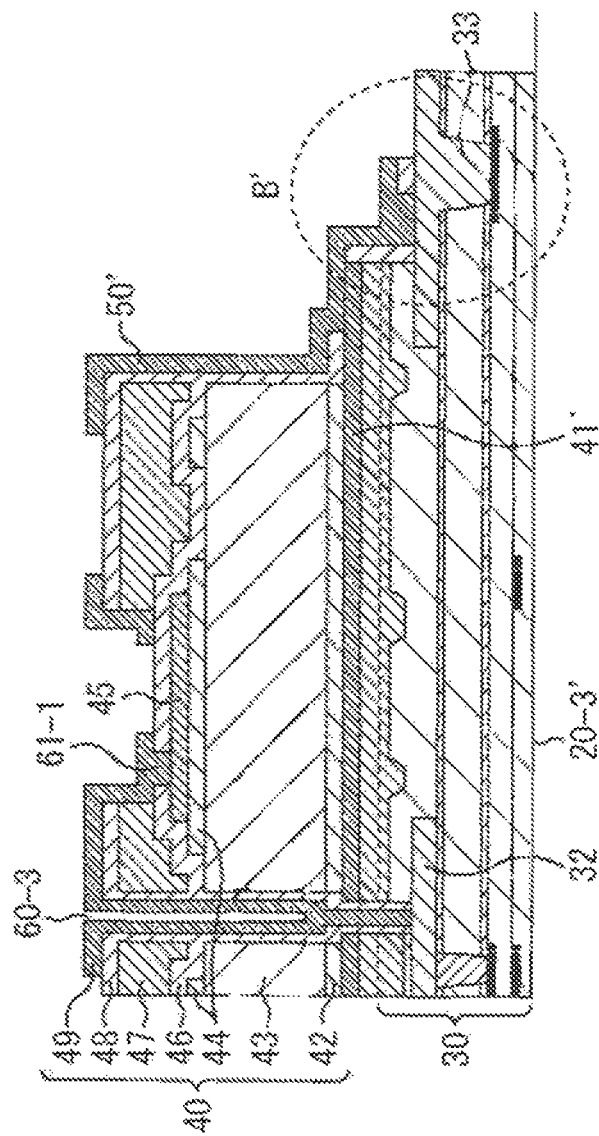
FIG. 4 A diagram showing another configuration of the pixel located in the outer peripheral portion.

A pixel 20-3' shown in FIG. 4 is a pixel provided in the pixel array section 10' while the configuration in which the through-via-hole 70 for connecting the electrode 41 and the lower electrode 50 to each other is not formed is employed. In the following description, the pixel shown in FIG. 4 will be referred to as the pixel 20-3' by adding an apostrophe for distinguishing it from the pixel 20-3 shown in FIG. 3. Although other portions will be referred in a similar way, the pixel 20-3' and the pixel 20-3 will be simply referred to as the pixels 20-3 if it is unnecessary to distinguish them.

The pixel 20-3' shown in FIG. 4 has a structure similar to that of the pixel 20-3 arranged in the area other than the outer peripheral portion of the pixel array section 10. However, the configuration in which the through-via-hole 70 is not formed on an outer peripheral portion side of the pixel array section 10 (right-hand side in FIG. 4) is employed.

A lower electrode 50' is connected to the grounded wire 33 at the end portion of the pixel array section 10'. Referring to a portion of the portion B' of FIG. 4, the lower electrode 50' is, at the end portion of the pixel array section 10', connected to the wire 33 inside the signal processing circuit 30. The lower electrode 50 and an electrode 41' inside the infrared image sensor 40 are also connected to each other at the end portion of the pixel array section 10'.

The electrode 41' of the infrared image sensor 40 is extended to the end portion (portion B') of the pixel array section 10 and connected to the lower electrode 50' at the end portion, in other words, at a portion outside a side surface of the pixel 20-3'. In this manner, a configuration in which the lower electrode 50', the electrode 41', and the wire 33 are connected to one another at the end portion of the pixel array section 10 can be achieved.

By making the lower electrode 50 as an electrode common to the plurality of pixels 20 in this manner, the miniaturization can be achieved. Further, it is also possible to increase the opening ratio of each pixel 20.

<Configuration of Light-Receiving Layer Area>

As described above, the upper electrode 49 is connected to the wire 32 inside the signal processing circuit 30 through the through-via-hole 60. The lower electrode 50 is connected to the electrode 41 inside the infrared image sensor 40 through the through-via-hole 70, and connected to the wire 33 inside the signal processing circuit 30 at the end portion and grounded. Otherwise, the lower electrode 50' is connected to the electrode 41' inside the infrared image sensor 40 at the end portion, and connected to the wire 33' inside the signal processing circuit 30 and grounded.

As such pixels including the upper electrode 49 and the lower electrode 50 are viewed from above, through-via-holes and P—InP layers 44 are formed at positions as shown in FIGS. 5A and 5B or 6A and 6B.

Figure 5A:
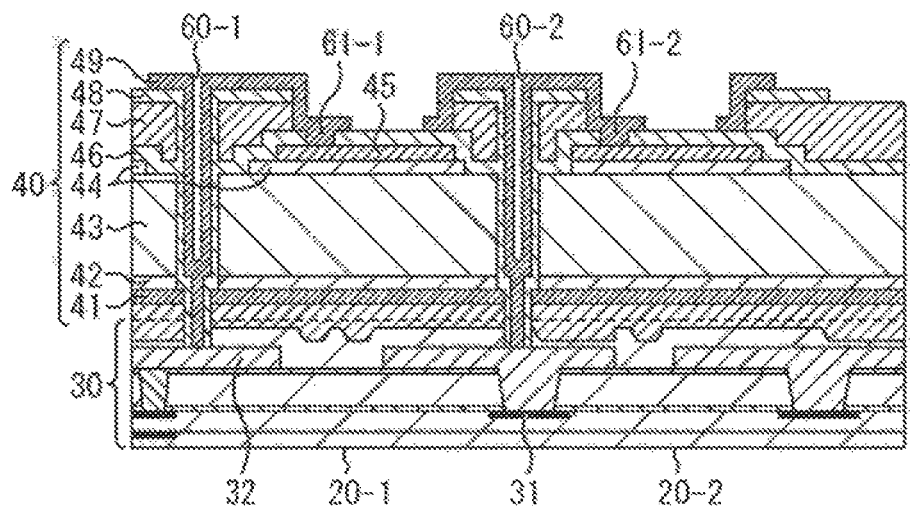
FIGS. 5A and 5B Diagrams for describing mesa isolation.
Figure 5B:
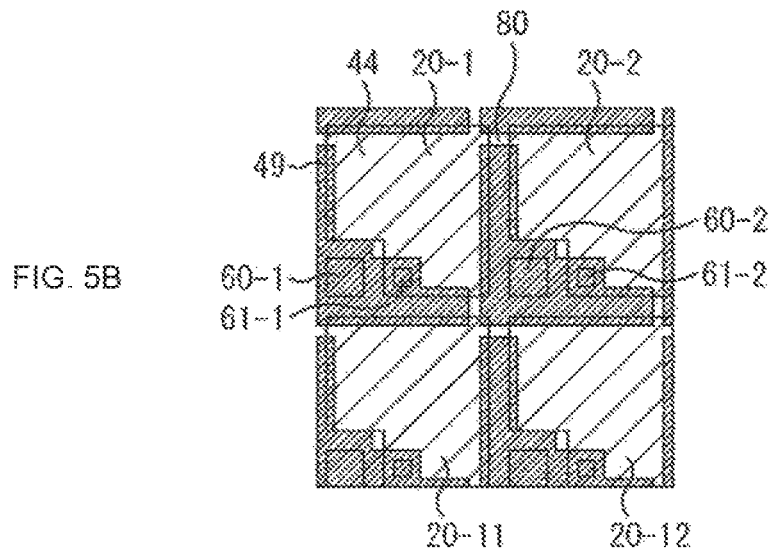

FIGS. 5A and 5B are cross-sectional views of pixels when the pixels are isolated by mesa isolation and a plan view thereof as viewed from above. The cross-sectional view of the pixels 20 shown in FIG. 5A is identical to a cross-sectional view of the pixels 20 shown in FIG. 2. FIG. 5B is a plan view of the pixels 20 shown in FIG. 5A as viewed from the light-receiving surface side and shows the positions of the via-holes and the area of the P—InP layers 44. In FIG. 5B, 4 pixels of 2-by-2 is shown.

As shown in FIG. 5B, an isolation portion 80 is provided between every two of the pixel 20-1, the pixel 20-2, a pixel 20-11, and a pixel 20-12 and they are isolated. The through-via-hole 60-1 is formed on a lower left side of the pixel 20-1. A through-via-hole 61-1 is formed on a right-hand side thereof. The upper electrode 49 is formed above the through-via-hole 60-1 and the through-via-hole 61-1 and also formed between the pixels 20. In addition, that upper electrode 49 is independently formed without being in contact with other upper electrodes 49.

Figure 6A:
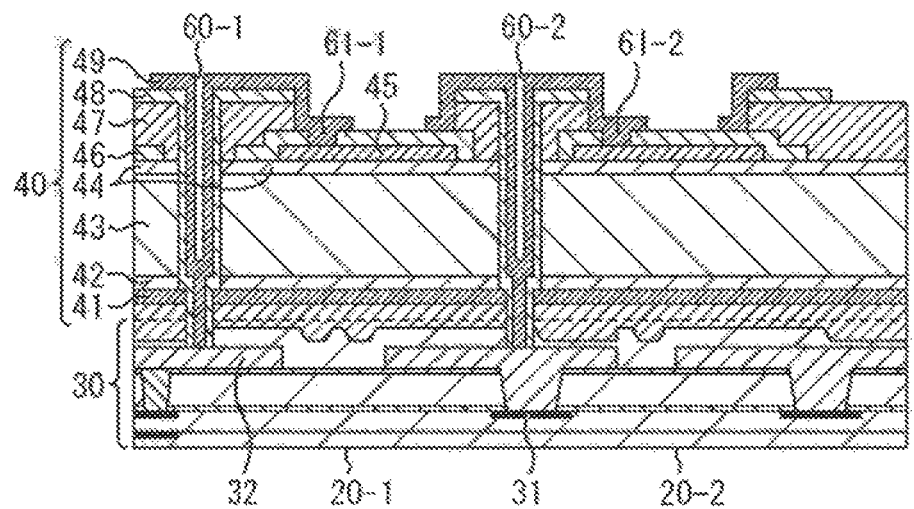
FIGS. 6A and 6B Diagrams for describing planar isolation.
Figure 6B:
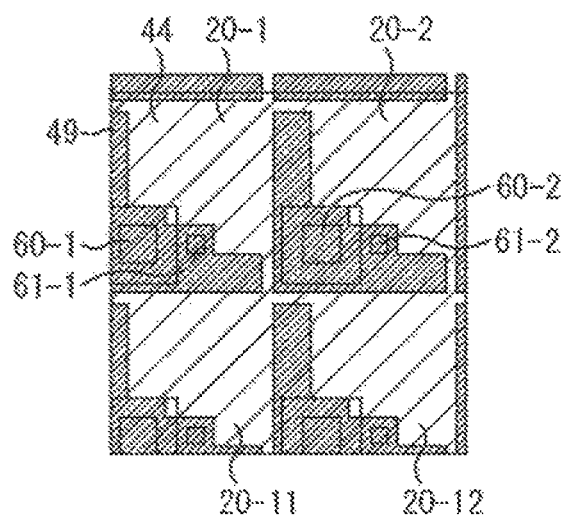
Figure 7:
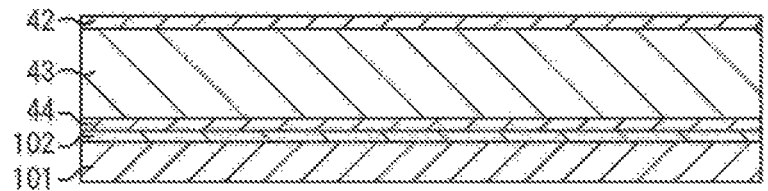
FIG. 7 A diagram for describing manufacture of the pixel.
Figure 7:
Figure 7:
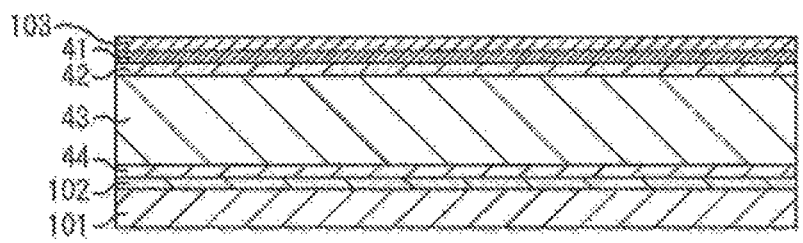
Figure 7:
Figure 7:
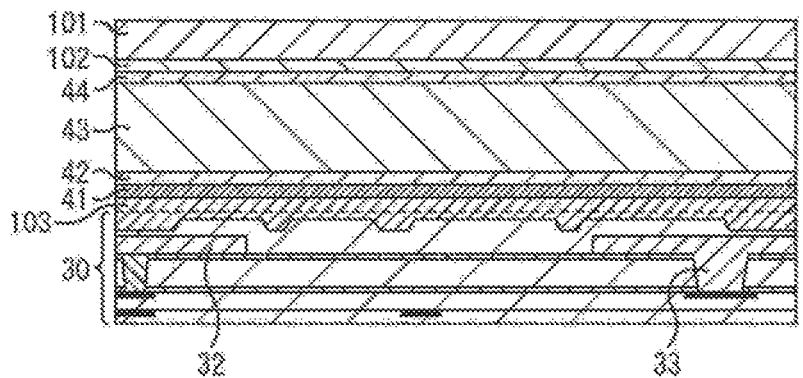
Figure 8:
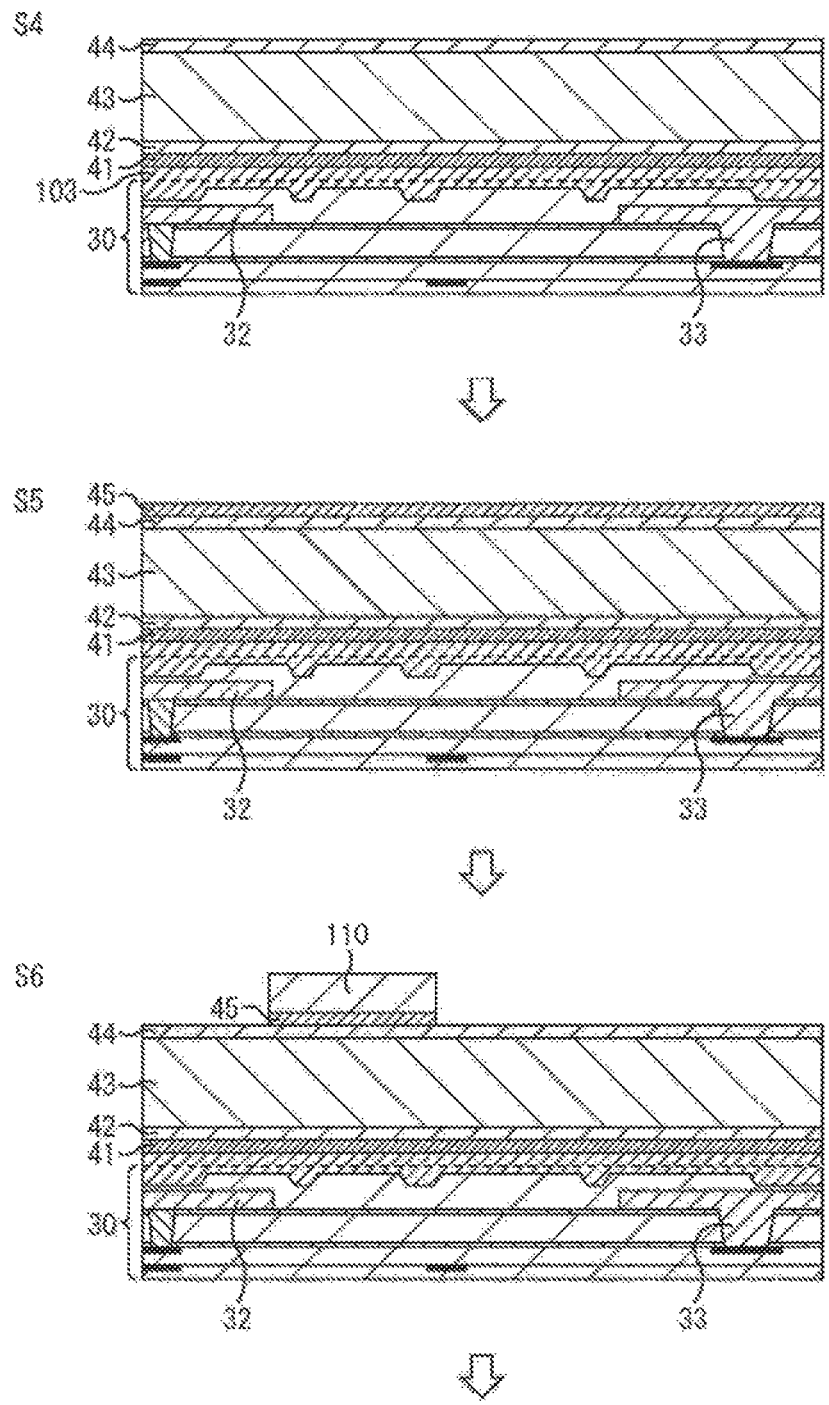
FIG. 8 A diagram for describing the manufacture of the pixel.
Figure 9:
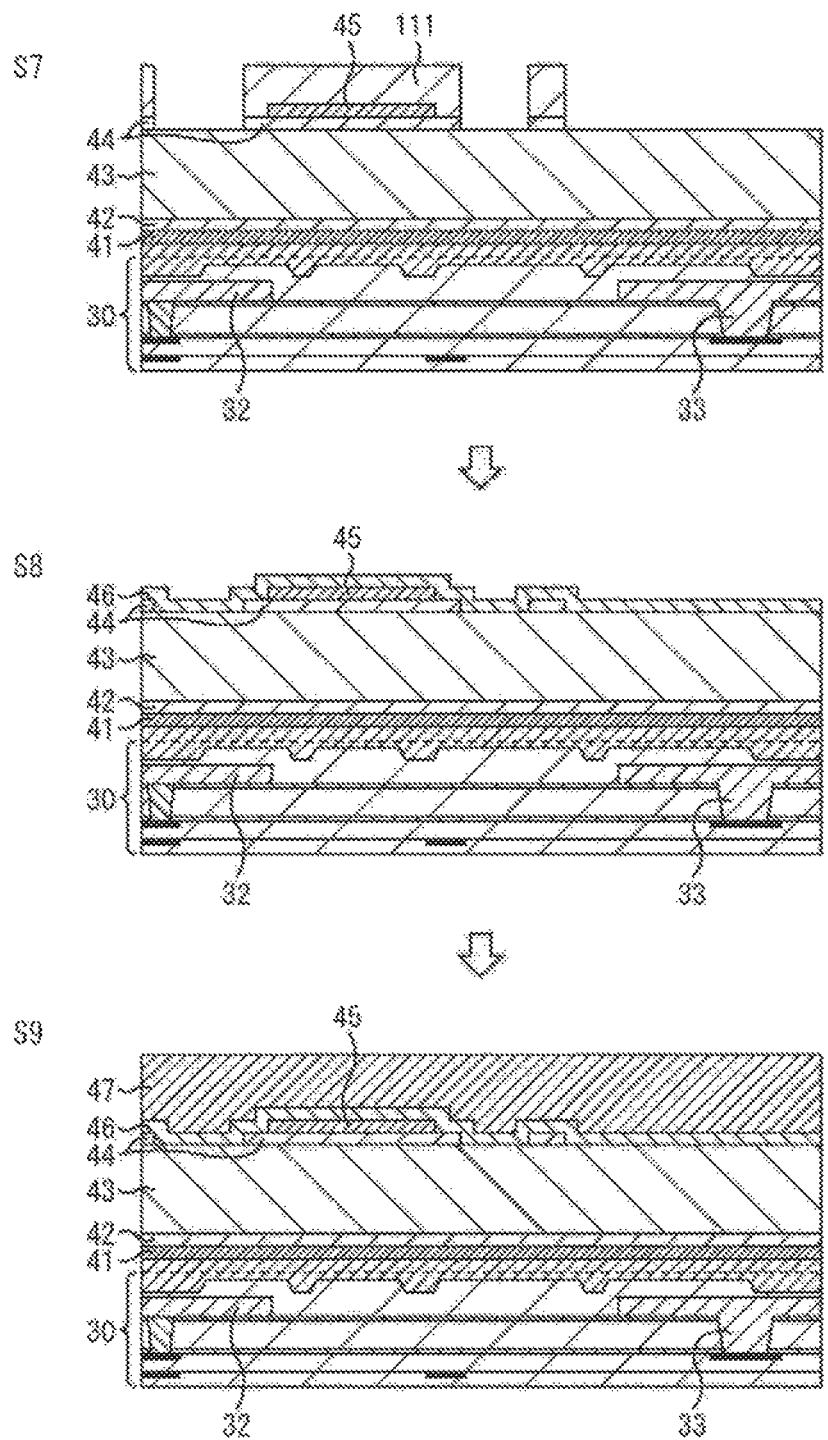
FIG. 9 A diagram for describing the manufacture of the pixel.

FIGS. 6A and 6B are cross-sectional views of pixels when the pixels are isolated by planar isolation and a plan view thereof as viewed from above. The cross-sectional view of the pixels 20 shown in FIG. 6A is approximately identical to a cross-sectional view of the pixels 20 shown in FIG. 5A. The pixels 20 shown in FIG. 6A is different from the pixels 20 shown in FIG. 5A in that each of the P—InP layers 44 is provided between the through-via-holes 60 and is not divided by the protection film 46.

FIG. 6B is a plan view of the pixels 20 shown in FIG. 6A as viewed from the light-receiving surface side, and shows the positions of the via-holes and the area of the P—InP layers 44. In FIG. 6B, 4 pixels of 2-by-2 is shown. A difference from the pixels 20 shown in FIG. 5B is that the P—InP layers 44 are continuous in a portion other than the through-via-holes 60-1. Note that the pixels 20 are isolated with impurities.

The area of the P—InP layers 44, i.e., the area of a P-layer of the planar isolation (FIGS. 6A and 6B) is larger than that of the mesa isolation (FIGS. 5A and 5B). Thus, the light-receiving layer area can be enlarged.

As described above, the present technology can be applied in the both isolation methods of the mesa isolation and the planar isolation. Further, the present technology can be applied also in an isolation method other than these methods.

Note that, although the shape of the through-via-hole 60 and the through-via-hole 61 is shown as the rectangular shape in FIG. 5B and FIG. 6B, other shapes such as a circular shape may be used.

<Regarding Manufacture>

Manufacture of the pixel 20 described above will be described with reference to FIGS. 7 to 12.

In Step S1 (FIG. 7), a substrate is prepared. As the substrate, an N—InGaAs layer 102 that is a buffer layer is formed on an n-InP layer 101 that is a supporting substrate, and a P—InP layer 44, an i-InGaAs layer 43, and an n-InP (n-InAlAs) layer 42 are formed on the N—InGaAs layer 102 in the stated order. The substrate can be formed by a crystal growth method or the like.

In Step S2, an electrode that becomes the upper electrode 49 is deposited on the substrate, and an insulation film (oxide film) 103 is deposited on the electrode. For example, the electrode is deposited with a material such as W (tungsten) and Ti (titanium) and the insulation film 103 is deposited with a material such as SiO2 (silicon dioxide).

In Step S3, bonding between the substrate (infrared image sensor 40) and the signal processing circuit 30 (ROIC substrate) is performed. The insulation film 103 deposited on a lower surface of the infrared image sensor 40 is made adhere to an upper surface of the signal processing circuit 30 with an adhesive. Note that the infrared image sensor 40 may be provided with the insulation film 103 and that insulation film 103 and the signal processing circuit 30 may be bonded to each other, though the bonding may be performed without the insulation film 103.

In accordance with the present technology, regarding the infrared image sensor 40 and the signal processing circuit 30, those substrates are bonded to each other with a predetermined adhesive or the like, and the step in which these are joined to each other with bumps or the like is not provided. The infrared image sensor 40 and the signal processing circuit 30 are formed of different materials. For example, the infrared image sensor 40 is formed of a compound semiconductor such as InGaAs and the signal processing circuit 30 is formed of a material such as a silicon (Si).

In this manner, the infrared image sensor 40 and the signal processing circuit 30 are formed of different materials. Thus, if these are joined to each other with bumps, there is a limitation on a material that can be used for the bumps. In addition, due to such a limitation, the bumps easily have variation in height and are liable to short-circuit, and hence there is a possibility that it may be difficult to control them and it may be difficult to achieve array formation and miniaturization.

However, in accordance with the present technology, bonding between the infrared image sensor 40 and the signal processing circuit 30 is achieved by adhesion of the substrates, not with the bumps. Thus, such problems that occur when the bumps are used does not occur, and it is possible to achieve array formation and miniaturization.

Further, the bumps are not used, and hence the material limitation when the bumps are used is overcome, and the degree of freedom of selection of a material for a bonding surface between the infrared image sensor 40 and the signal processing circuit 30 increases.

In Step S4 (FIG. 8), the n-InP layer 101 and the N—InGaAs layer 102 are pealed off. Inp absorbs visible light, and hence it is favorable to make it as thin as possible. Therefore, the n-InP layer 101 used as the supporting substrate and the N—InGaAs layer 102 deposited as the buffer layer are pealed off in Step S4.

In Step S5, an ITO 45 is deposited. The ITO 45 is a transparent electrode film. The ITO 45 is connected to the upper electrode 49, and used for reading out a carrier photoelectrically converted at the light-receiving layer (i-InGaAs layer 43). In accordance with the present technology, the ITO 45 is formed on the light-receiving surface side, and thus the electrode for collecting the carrier can be arranged on the light-receiving surface side.

If the electrode is formed such that the electrode for collecting the carrier is located in a surface on a side opposite to the light-receiving surface, there is a possibility that the carrier photoelectrically converted at a front face of the light-receiving surface may be re-combined before it reaches the electrode and the sensitivity may lower. However, in accordance with the present technology, the ITO 45 is formed on the light-receiving surface side. Thus, it becomes possible to prevent the sensitivity from lowering and to improve the sensitivity.

In Step S6, the ITO 45 is processed. The ITO 45 is processed by applying a resist 110 on a portion in which the ITO 45 is to be left and performing etching.

In Step S7 (FIG. 9), the P—InP layer 44 is processed. The P—InP layer 44 is processed by applying a resist 111 on a portion in which the P—InP layer 44 is to be left and performing etching. The mask shape of this resist 111 is different between the case of the mesa isolation described with reference to FIGS. 5A and 5B and the case of the planar isolation described with reference to FIGS. 6A and 6B. A shape suitable for the applied isolation method is used therefor.

In Step S8, the protection film 46 is deposited on the ITO 45 and the P—InP layer 44 after processing. This protection film 46 can be deposited as an interface protection film, and SiN (silicon nitride) can be, for example, used for the material.

In Step S9, the insulation film 47 is deposited. The insulation film 47 can be, for example, a SiO2 film.

In Step S10 (FIG. 10), a resist 112 is applied on a portion other than the portion in which the through-via-hole 60 (70) is to be formed, a hard mask is formed, and etching is performed.

In Steps S10 to S12, the through-via-hole 60 (70) is formed. The patterning shape in Step S10 varies in a manner that depends on a case of manufacturing the pixel 20 with the through-via-hole 70 as described with reference to FIG. 3 or a case of manufacturing the pixel 20 without the through-via-hole 70 as described with reference to FIG. 4. Here, the description will be continued, taking the case of manufacturing the pixel 20 without the through-via-hole 70 as described with reference to FIG. 4 as an example.

Figure 10:
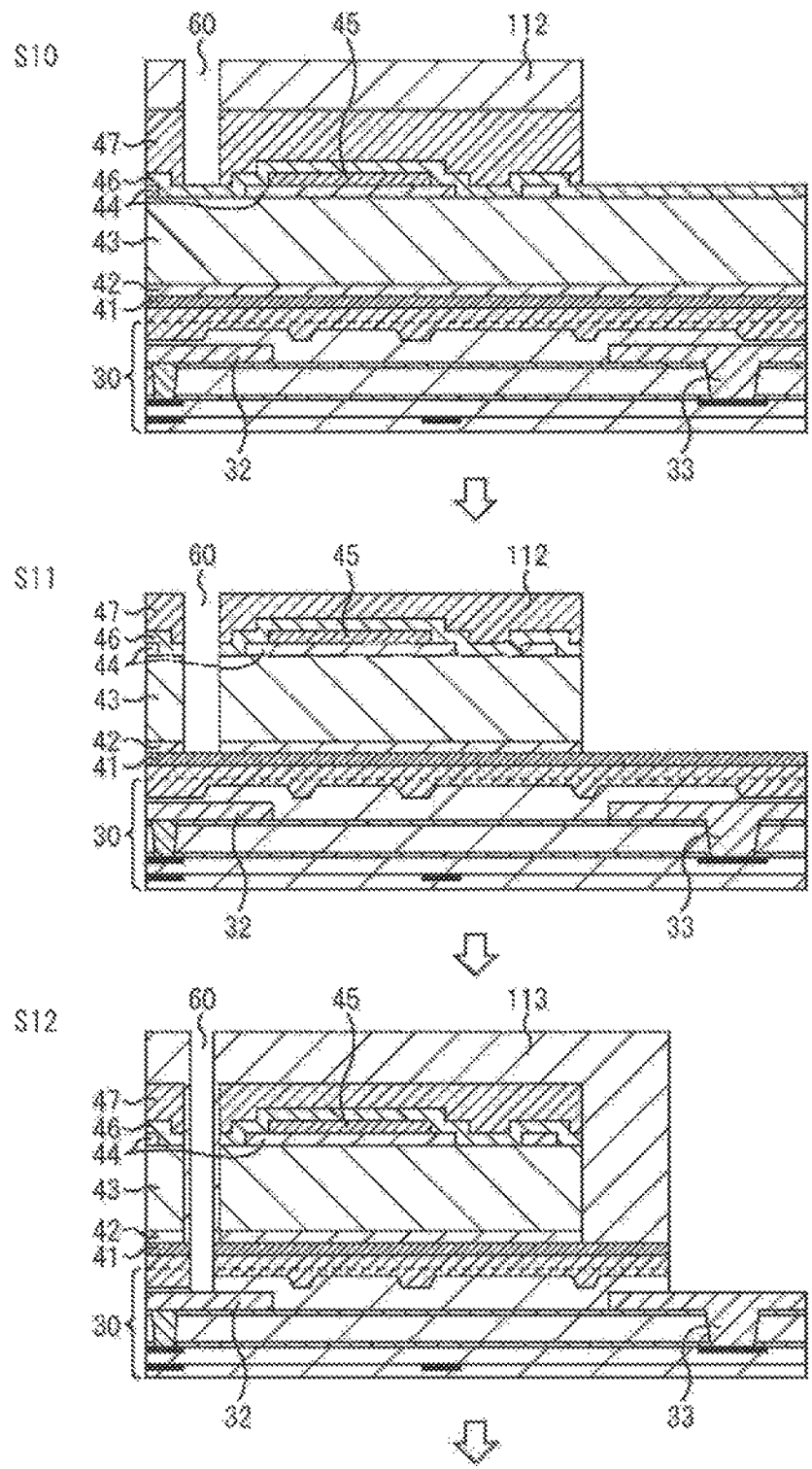
FIG. 10 A diagram for describing the manufacture of the pixel.

In Step S10, the insulation film 47 of the portion in which the through-via-hole 60 is to be formed is removed. Further, as shown in FIG. 10, the insulation film 47 is removed also in the portion located at an end side of the pixel array section 10'.

In Step S11, the portion corresponding to a part of the through-via-hole 60 is formed by processing InGaAs. At the time of Step S11, the i-InGaAs layer 43 and the n-InP layer 42 that are the portion in which the through-via-hole 60 is to be formed are removed. Further, as shown in FIG. 10, the i-InGaAs layer 43 and the n-InP layer 42 are removed also in the portion located on the end side of the pixel array section 10'.

In Step S12, by applying a resist 113 and performing etching, the electrode 41 and the signal processing circuit 30 that are the portion in which the through-via-hole 60 is to be formed are removed to the upper surface of the wire 32. Further, the electrode 41 and the signal processing circuit 30 are removed to the upper surface of the wire 33 also in the portion located on the end side of the pixel array section 10'.

Note that, although the through-via-hole 60 is formed in Steps S10 to S12 here, the processing may be performed to the wire 32 (33) of the signal processing circuit 30, for example, in Step S10 without such steps at a time.

Note that, in the case of manufacturing the pixel 20 including the through-via-hole 70 shown in FIG. 3, the through-via-hole 70 can be formed by stopping the processing in the state shown at Step S11. That is, the through-via-hole 70 can be formed as a part of the through-via-hole 60 in Steps S10 and S11. Then, in Step S12, the through-via-hole 60 and the through-via-hole 70 can be formed by processing the other part of the through-via-hole 60.

Figure 11:
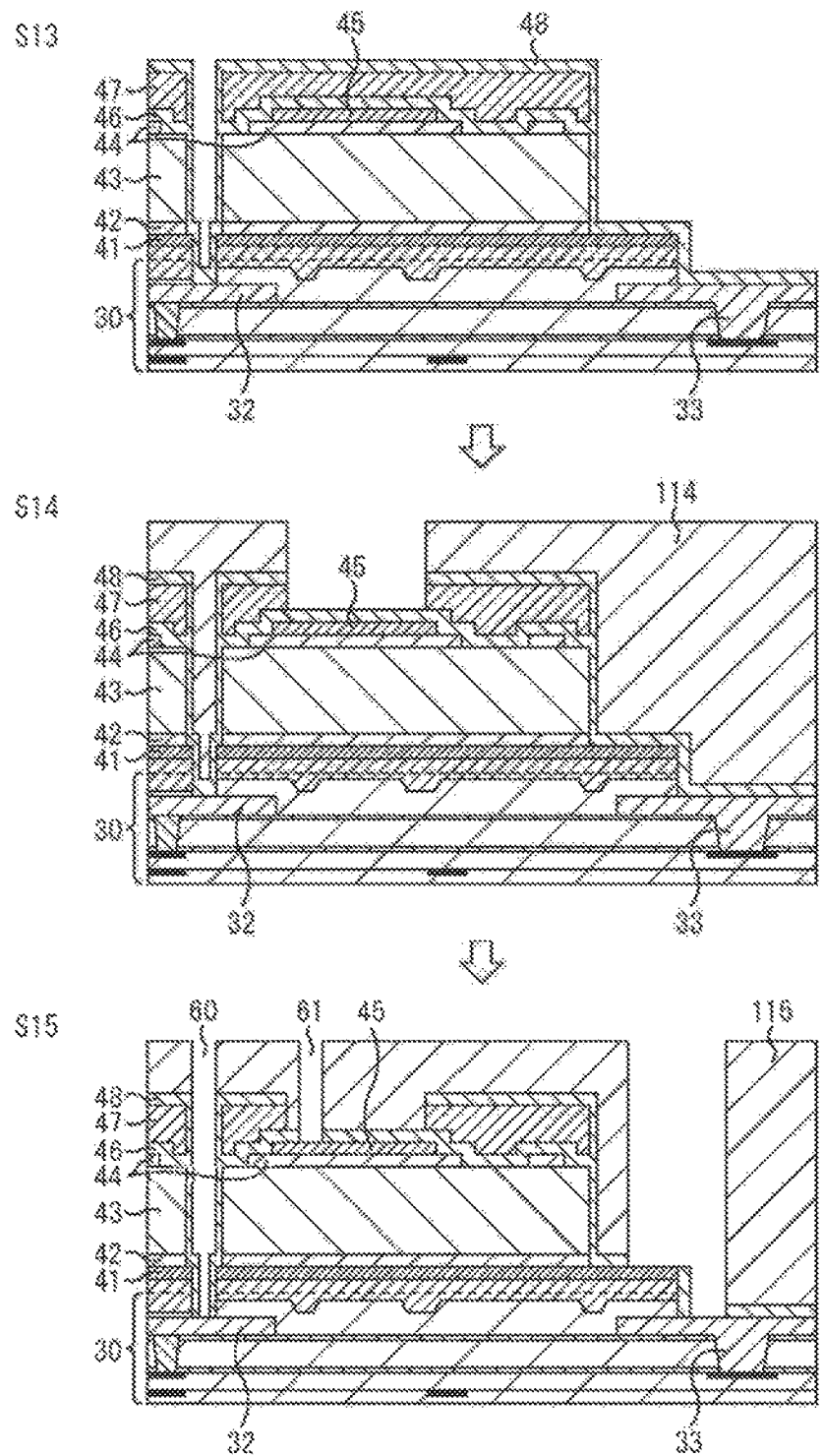
FIG. 11 A diagram for describing the manufacture of the pixel.
Figure 12:
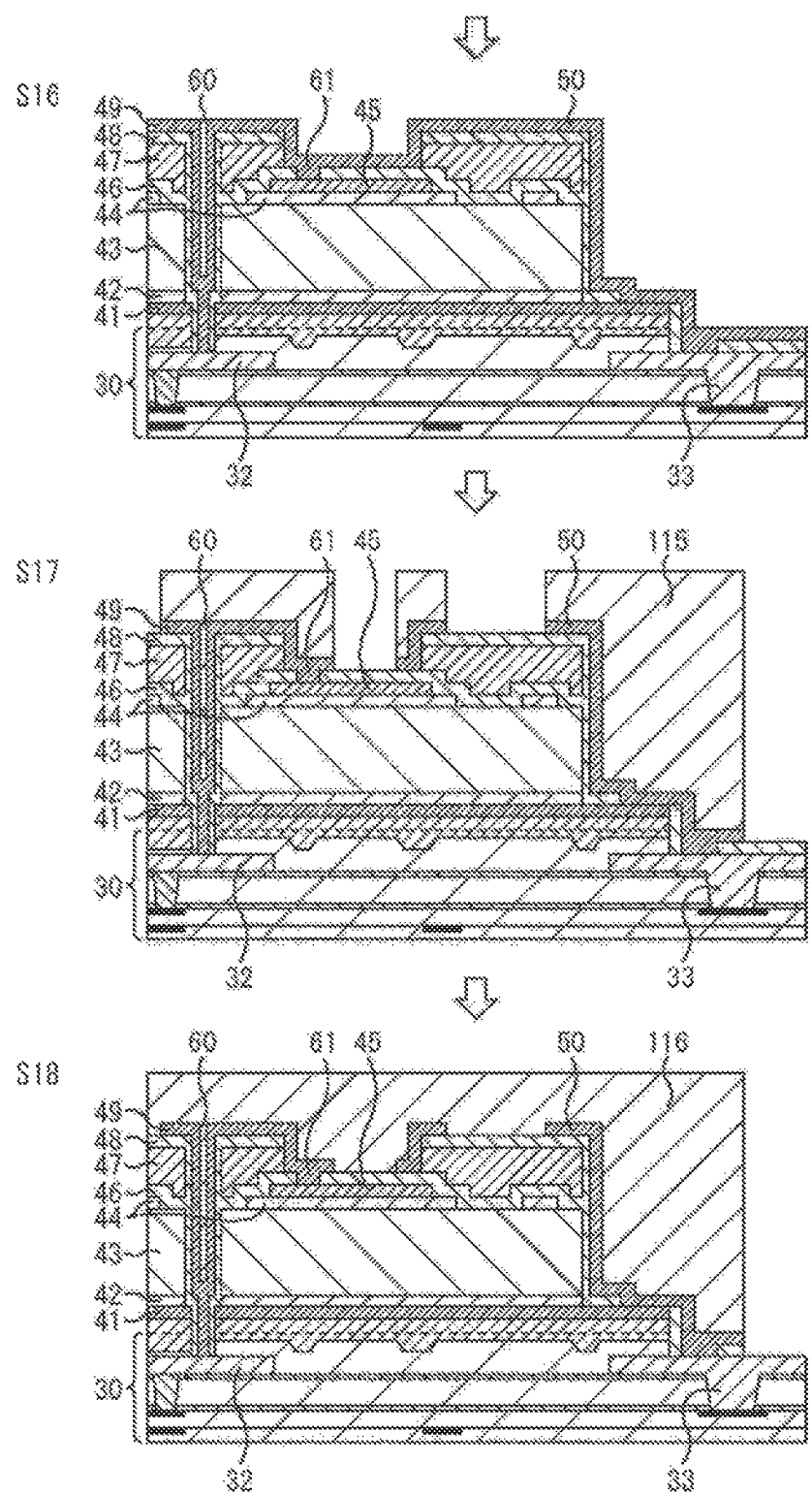
FIG. 12 A diagram for describing the manufacture of the pixel.

In Step S13 (FIG. 11), the protection film 48 is deposited. As shown in FIG. 11, the protection film 48 is formed on the insulation film 47 and is also deposited on the side surface of the through-via-hole 60. Further, on the end side of the pixel array section 10', the protection film 48 is deposited on the electrode 41 and also on the wire 33 of the signal processing circuit 30.

In Step S14, the opening portion of the pixel 20 is formed. By applying a resist 114 on a portion other than the opening portion and performing etching, the opening portion is formed. As shown in FIG. 11, the insulation film 47 and the protection film 48 on the portion in which the ITO 45 is formed is removed.

In Step S15, a resist 115 for forming a portion to be connected to the upper electrode 49 or the lower electrode 50 is applied and etching is performed. As a result of the etching, the protection film 48 deposited on the wire 32 in the through-via-hole 60 is removed. Further, the through-via-hole 61 is formed by removing the protection film 48 on the ITO 45. Further, the protection film 48 on the electrode 41 on the end side of the pixel array section 10' is removed.

In Step S16 (FIG. 12), a connection electrode is deposited. In Step S16, an electrode that becomes the upper electrode 49 and the lower electrode 50 is deposited with W (tungsten), for example.

In Step S17, etching of the connection electrode is performed. By applying a resist 115 on portions in which the upper electrode 49 and the lower electrode 50 to be left and performing etching, the upper electrode 49 and the lower electrode 50 are formed.

In Step S18, the PAD is opened by applying a resist 116 and performing etching. The protection film 48, which is on the end side of the pixel array section 10' in FIG. 12 and is on the wire 33 of the signal processing circuit 30, is removed. A portion of the wire 33, which is exposed after this protection film 48 is removed, and a circuit (not shown) are connected to each other.

By removing the resist 116, the pixel 20-3' shown in FIG. 4 is manufactured. Further, the pixels 20 (FIG. 2) in the area other than the pixel array section 10' are also manufactured in the above-mentioned steps. In this manner, the pixels 20 are manufactured.

In accordance with the present technology, it is possible to achieve miniaturization, planarization, and an improvement of the sensitivity of the infrared image sensor 40.

<Usage Examples of Imaging Apparatus>

Figure 13:
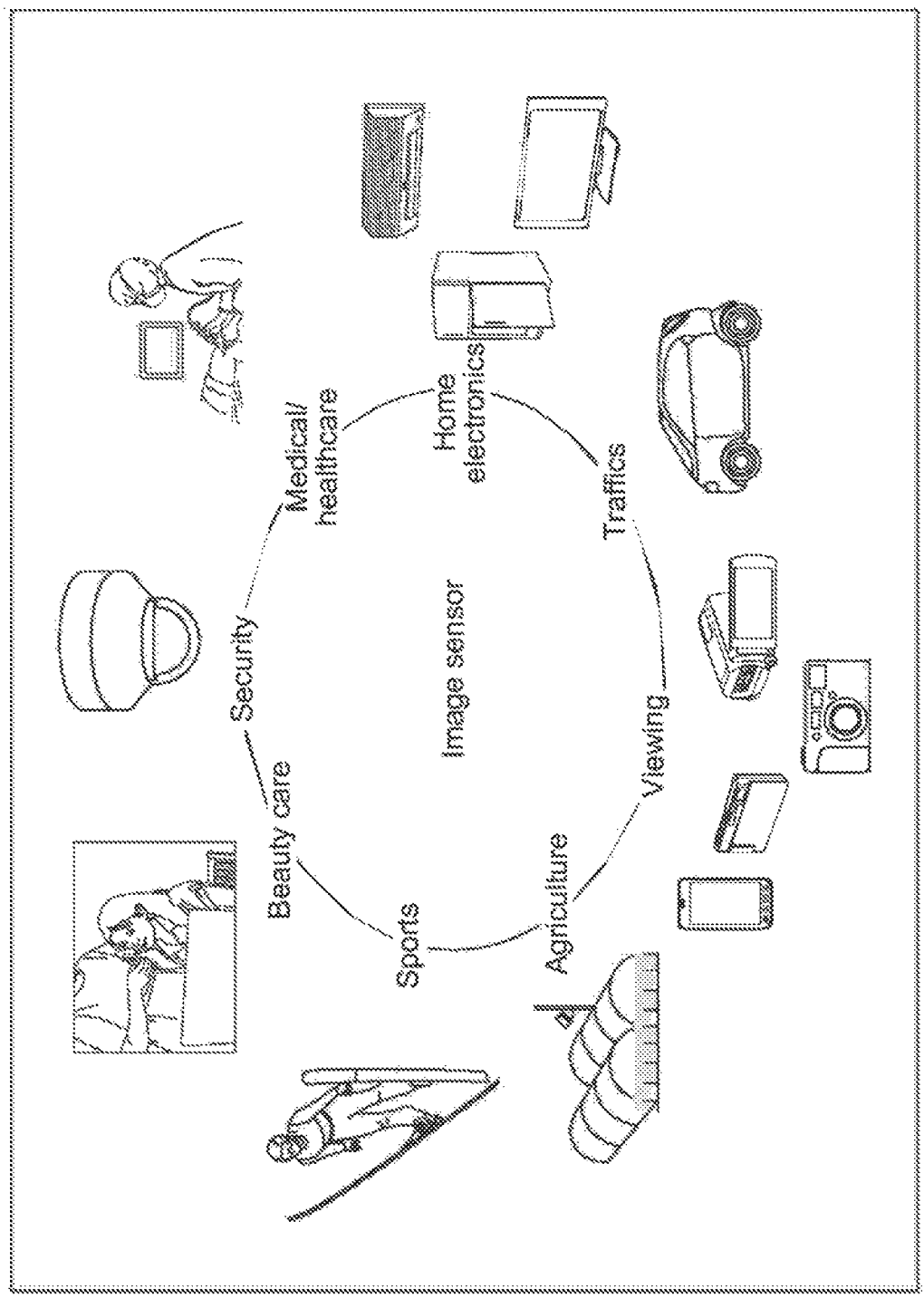
FIG. 13 A diagram showing usage examples of an imaging apparatus.

FIG. 13 is a diagram showing usage examples of the above-mentioned imaging apparatus.

The above-mentioned imaging apparatus can be used in various cases of sensing light such as visible light, infrared light, ultraviolet light, and X-rays as follows, for example.

Figure 14:
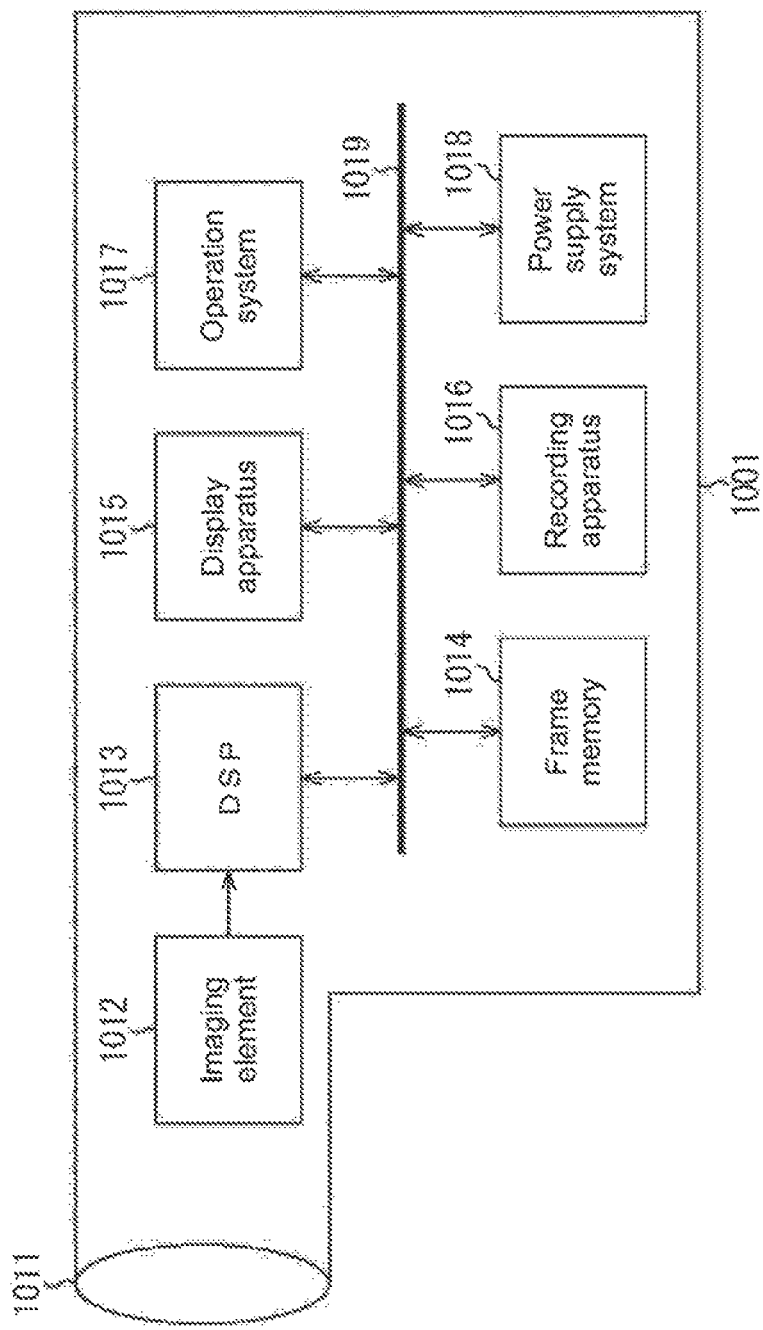
FIG. 14 A diagram showing a configuration of the imaging apparatus.

- An apparatus for photographing images to be viewed, such as a digital camera and a camera-equipped mobile apparatus
- An apparatus used for traffic purposes, such as a car-mounted sensor that photographs front/rear/periphery/inside of an automobile, a surveillance camera that monitors running vehicles and roads, and a distance measurement sensor that measures distances among vehicles, for safe driving including automatic stop, recognition of a driver condition, and the like
- An apparatus used in home electronics such as a TV, a refrigerator, and an air conditioner, for photographing gestures of users and executing apparatus operations according to the gestures
- An apparatus used for medical and healthcare purposes, such as an endoscope and an apparatus that performs blood vessel photographing by receiving infrared light
- An apparatus used for security purposes, such as a surveillance camera for crime-prevention purposes and a camera for person authentication purposes
- An apparatus used for beauty care purposes, such as a skin measurement apparatus that photographs skins and a microscope that photographs scalps
- An apparatus used for sports purposes, such as an action camera and a wearable camera for sports purposes
- An apparatus for agriculture purposes, such as a camera for monitoring states of fields and crops FIG. 14 is a block diagram showing a configuration example of an imaging apparatus (camera apparatus) 1001 that is an example of an electronic apparatus to which the present technology is applied.

As shown in FIG. 14, the imaging apparatus 1001 includes an optical system including a lens group 1011 and the like, an imaging element 1012, a DSP 1013 that is a camera signal processing unit, a frame memory 1014, a display apparatus 1015, a recording apparatus 1016, an operation system 1017, a power supply system 1018, and the like. Further, in this configuration, the DSP 1013, the frame memory 1014, the display apparatus 1015, the recording apparatus 1016, the operation system 1017, and the power supply system 1018 are connected to one another via a bus line 1019.

The lens group 1011 captures incident light (image light) from an object and forms an image on an imaging surface of the imaging element 1012. The imaging element 1012 converts the amount of incident light, of which the image is formed on the imaging surface by the lens group 1011, into electric signals on a pixel-by-pixel basis and outputs them as pixel signals.

The display apparatus 1015 includes, for example, a panel-type display apparatus such as a liquid crystal display apparatus and an EL (organic electro luminescence) display apparatus. The display apparatus 1015 displays moving images or still images captured by the imaging element 1012. The recording apparatus 1016 records moving images or still images captured by the imaging element 1012 on a recording medium such as a memory card, a video tape, and a DVD (Digital Versatile Disk).

The operation system 1017 issues operation commands regarding various functions of this imaging apparatus 1001 in accordance with user's operations. The power supply system 1018 appropriately supplies various power supplies that become operation power supplies for the DSP 1013, the frame memory 1014, the display apparatus 1015, the recording apparatus 1016, and the operation system 1017 to these supply targets.

Such an imaging apparatus 1001 is applied to a video camera and a digital still camera, and further, a camera module intended for a mobile apparatus such as a smartphone and a mobile phone. Further, in this imaging apparatus 1001, an imaging apparatus according to each of the above-mentioned embodiments can be used as the imaging element 1012. With this, the image quality of the imaging apparatus 1001 can be improved.

In the present specification, the system refers to an entire apparatus constituted of a plurality of apparatuses.

It should be noted that the effects described in the present specification are merely illustrative and not limitative and other effects may be given.

It should be noted that embodiments of the present technology are not limited to the above-mentioned embodiments but various modifications can be made without departing from the gist of the present technology.

It should be noted that the present technology can also take the following configurations.

(1) An imaging apparatus, including:
a light-receiving element array in which a plurality of light-receiving elements including a compound semiconductor having light-receiving sensitivity in an infrared range are arrayed;
a signal processing circuit that processes a signal from the light-receiving element;
an upper electrode formed on a light-receiving surface side of the light-receiving element; and
a lower electrode that is paired with the upper electrode, in which
the light-receiving element array and the signal processing circuit are joined to each other with a film of a predetermined material,
the upper electrode and the signal processing circuit are connected to each other through a through-via-hole penetrating a part of the light-receiving element, and
the lower electrode is made as an electrode common to the light-receiving elements arrayed in the light-receiving element array.

(2) The imaging apparatus according to (1), in which
the compound semiconductor is a group III-V semiconductor compound.

(3) The imaging apparatus according to (1) or (2), in which
the lower electrode and the electrode are connected to each other through a through-via-hole penetrating to an electrode provided in a lower portion of the light-receiving element.

(4) The imaging apparatus according to any of (1) to (3), in which
the lower electrode is, at an outer peripheral portion of the light-receiving element array, connected to an electrode provided in a lower portion of the light-receiving element.

(5) The imaging apparatus according to any of (1) to (4), in which
the lower electrode is connected to the signal processing circuit at an outer peripheral portion of the light-receiving element array.

(6) The imaging apparatus according to any of (1) to (5), in which
the through-via-hole has an interior covered with a fixed-charge film on which a part of the upper electrode is stacked.

(7) A manufacturing method of manufacturing an imaging apparatus including
a light-receiving element array in which a plurality of light-receiving elements each including a compound semiconductor having light-receiving sensitivity in an infrared range are arrayed,
a signal processing circuit that processes a signal from the light-receiving element,
an upper electrode formed on a light-receiving surface side of the light-receiving element, and
a lower electrode that is paired with the upper electrode, the manufacturing method including steps of:
joining the light-receiving element array and the signal processing circuit to each other with a film of a predetermined material;
forming a through-via-hole penetrating a part of the light-receiving element;
connecting the upper electrode and the signal processing circuit to each other through the through-via-hole; and
forming the lower electrode as an electrode common to the light-receiving elements arrayed in the light-receiving element array.

(8) The manufacturing method according to (7), in which
the compound semiconductor is a group III-V semiconductor compound.

(9) The manufacturing method according to (7) or (8), further including steps of:
forming an electrode in a lower portion of the light-receiving element;
forming, in a part of the light-receiving element, a through-via-hole penetrating to an upper surface of the electrode; and
connecting the lower electrode and the electrode to each other through the through-via-hole.

(10) The manufacturing method according to any of (7) to (9), further including
a step of connecting, at an outer peripheral portion of the light-receiving element array, the lower electrode to an electrode provided in a lower portion of the light-receiving element.

(11) The manufacturing method according to (7) to (10), further including a step of connecting the lower electrode to the signal processing circuit at an outer peripheral portion of the light-receiving element array.

REFERENCE SIGNS LIST

10 pixel array section
20 pixel
30 signal processing circuit
31 electrode
32, 33 wire
40 infrared image sensor
41 electrode
42 n-InP layer
43 i-InGaAs layer
44 P—InP layer
45 ITO
46 protection film
47 insulation film
48 protection film
49 upper electrode
50 lower electrode
60, 61, 70 through-via-hole

The invention claimed is:

1. A method of manufacturing an imaging apparatus, comprising:
joining a light-receiving element array to a signal processing circuit by an adhesive film, wherein the light-receiving element array comprises a plurality of light-receiving elements,
each of the plurality of light-receiving elements includes a compound semiconductor having light-receiving sensitivity in an infrared range, and
the signal processing circuit processes a signal from the plurality of the light-receiving elements;
forming a first through-via-hole penetrating a part of a light-receiving element of the plurality of light-receiving elements;
connecting an upper electrode to the signal processing circuit via the first through-via-hole;
forming a first lower electrode common to each of the plurality of light-receiving elements arrayed in the light-receiving element array, wherein
the upper electrode is on a light-receiving surface side of the plurality of light-receiving elements, and
the first lower electrode is paired with the upper electrode; and
forming a protection film on a side surface of the first through-via-hole and on a surface of a wire of the signal processing circuit.

2. The method according to claim 1, wherein the compound semiconductor is a group III-V semiconductor compound.

3. The method according to claim 1, further comprising:
forming a second lower electrode in a lower portion of the light-receiving element;
forming, in a part of the light-receiving element, a second through-via-hole penetrating an upper surface of the second lower electrode; and
connecting the first lower electrode to the second lower electrode via the second through-via-hole.

4. The method according to claim 1, further comprising:
forming a second lower electrode in a lower portion of the light-receiving element; and
connecting, at an outer peripheral portion of the light-receiving element array, the first lower electrode to the second lower electrode.

5. The method according to claim 1, further comprising connecting the first lower electrode to the signal processing circuit at an outer peripheral portion of the light-receiving element array.

* * * * *